United States Patent
Chen (10) Patent No.: US 10,818,701 B2
(45) Date of Patent: Oct. 27, 2020

(54) DISPLAY PANEL AND METHOD OF MANUFACTURING THE SAME

(71) Applicants: HKC Corporation Limited, Shenzhen, Guangdong (CN); Chongqing HKC Optoelectronics Technology Co., Ltd., Chongqing (CN)

(72) Inventor: Yu-Jen Chen, Chongqing (CN)

(73) Assignees: HKC Corporation Limited, Shenzhen, Guangdong (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 0 days.

(21) Appl. No.: 16/461,677

(22) PCT Filed: May 5, 2017

(86) PCT No.: PCT/CN2017/083216
§ 371 (c)(1),
(2) Date: May 16, 2019

(87) PCT Pub. No.: WO2018/120571
PCT Pub. Date: Jul. 5, 2018

(65) Prior Publication Data
US 2019/0355753 A1   Nov. 21, 2019

(30) Foreign Application Priority Data
Dec. 30, 2016   (CN) .......................... 2016 1 1256155

(51) Int. Cl.
*H01L 27/12*   (2006.01)
*H01L 29/49*   (2006.01)
*G02F 1/1343*  (2006.01)
*G02F 1/136*   (2006.01)

(52) U.S. Cl.
CPC ...... *H01L 27/124* (2013.01); *G02F 1/134363* (2013.01); *H01L 27/1259* (2013.01); *H01L 29/4908* (2013.01); *G02F 1/136* (2013.01)

(58) Field of Classification Search
CPC .............. H01L 27/124; H01L 27/1259; H01L 29/4908; G02F 1/134363; G02F 1/136
USPC ......................................................... 257/72
See application file for complete search history.

(56) References Cited

U.S. PATENT DOCUMENTS

| 2005/0122443 A1* | 6/2005 | Kim .................. G02F 1/136286 349/46 |
| 2014/0145182 A1* | 5/2014 | Yamazaki ............. H01L 27/124 257/43 |
| 2015/0091004 A1* | 4/2015 | Kim ....................... H01L 27/124 257/43 |

FOREIGN PATENT DOCUMENTS

| CN | 101009250 A | 8/2007 |
| CN | 101325201 A | 12/2008 |
| CN | 102645807 A | 8/2012 |
| CN | 102768992 A | 11/2012 |

(Continued)

*Primary Examiner* — Tong-Ho Kim
(74) *Attorney, Agent, or Firm* — Muncy, Geissler, Olds & Lowe, P.C.

(57) ABSTRACT

A display panel includes a substrate and a first layer of wires. The first layer of wires are disposed on the substrate. A lower portion of the first layer of wires includes a first high attachment metal layer, an upper portion of the first layer of wires includes a second high attachment metal layer, and a middle of the first layer of wires includes an intermediate electroconductive layer. The first layer of wires are connected to a column scan driver of the display panel.

12 Claims, 5 Drawing Sheets

(56) References Cited

FOREIGN PATENT DOCUMENTS

| CN | 106653772 A | 5/2017 |
|----|-------------|--------|
| JP | 2000305104 A | 11/2000 |

\* cited by examiner

DISPLAY PANEL AND METHOD OF MANUFACTURING THE SAME

BACKGROUND

Technology Field

This disclosure relates to the technical field of a display, and more particularly to a display panel and a method of manufacturing a display panel.

Description of Related Art

The liquid crystal display has many advantages, such as the thin body, low power consumption, and no radiation, and is widely applied. Most of the liquid crystal displays available in the market are backlight type liquid crystal displays each including a liquid crystal panel and a backlight module. The working principle of the liquid crystal panel is to place the liquid crystal between two parallel glass substrates, and to apply a driving voltage to the two glass substrates to control the orientation of the liquid crystal, and refract the light emitted from the backlight module to generate an image frame.

The thin-film-transistor liquid crystal display (TFT-LCD) has the properties including the low power consumption, excellent frame quality and higher production yield, and has gradually become the most popular product in the display field. Similarly, the TFT-LCD includes a liquid crystal panel and a backlight module. The liquid crystal panel includes a color filter substrate (CF substrate) and a thin-film-transistor substrate (TFT substrate). The opposite inner sides of the above substrates are configured with transparent electrodes, respectively. A layer of liquid crystal (LC) is interposed between the two substrates. The liquid crystal panel controls the orientation of the liquid crystal through the electric field to change the polarization state of light, and a polarizer is adopted to implement the transmission and obstruction of the light path and thus the displaying objectives.

With the development of the thin-film-transistor liquid crystal display (TFT LCD) toward the oversized, high driving frequency and high resolution trends, the technology of the high-quality wire process has become the master when the TFT LCD is manufactured. In order to handle the future high frequency and high resolution LCD specifications, how to effectively decrease the resistance and the parasitic capacitance of the wire of the panel becomes increasingly important. At present, the poor sticky property of the wires tends to occur in the wire metal structure in the process of forming the second layer of wires, thereby causing the problem of peel off of the metal film.

SUMMARY

The technical problem to be solved by this disclosure is to provide a display panel solving the problem that a first layer of wires have poor sticky properties.

In addition, this disclosure further provides a method of manufacturing a display panel.

An objective of this disclosure is implemented through the following technical solution. A display panel comprises: a substrate; and a first layer of wires, wherein the first layer of wires are disposed on the substrate, a lower portion of the first layer of wires comprises a first high attachment metal layer, an upper portion of the first layer of wires comprises a second high attachment metal layer, a middle of the first layer of wires comprises an intermediate electroconductive layer, and the first layer of wires are connected to a column scan driver of the display panel.

In this aspect, a thickness of the intermediate electroconductive layer is greater than a thickness of the first high attachment metal layer and a thickness of the second high attachment metal layer.

The thickness of the intermediate electroconductive layer is greater than the thickness of the first high attachment metal layer, and is also greater than the thickness of the second high attachment metal layer. The intermediate electroconductive layer may be made using a metal material having a lower resistance characteristic, wherein the larger thickness can effectively decrease the resistance and the parasitic capacitance of the first layer of wires of the panel, the first high attachment metal layer and the second high attachment metal layer are made using a metal material having better adhesion performance, the intermediate electroconductive layer is connected to the upper and lower layers through the first high attachment metal layer and the second high attachment metal layer, the sticky property is better, the peeling of the intermediate electroconductive layer and the upper and lower layers cannot be easily caused, and the first high attachment metal layer and the second high attachment metal layer are mainly used to stuck to the upper and lower layers with the small thickness to save the cost.

In this aspect, a width of a bottom portion of the intermediate electroconductive layer is greater than a width of a top portion of the intermediate electroconductive layer, a width of the first high attachment metal layer is the same as the width of the bottom portion of the intermediate electroconductive layer, and a width of the second high attachment metal layer is the same as the width of the top portion of the intermediate electroconductive layer.

Since the width of the bottom portion of the intermediate electroconductive layer is greater than the width of the top portion of the intermediate electroconductive layer, it is convenient to the manufacturing, the formation is stable, and the yield is high. Since the width of the first high attachment metal layer is the same as the width of the bottom portion of the intermediate electroconductive layer, and the width of the second high attachment metal layer is the same as the width of the top portion of the intermediate electroconductive layer, it is convenient to the manufacturing, the contact surface areas between the intermediate electroconductive layer and the first high attachment metal layer and the second high attachment metal layer become the maximum, and the sticky effect becomes better, wherein the intermediate electroconductive layer is preferably a trapezoid, and more particularly an isosceles trapezoid.

In this aspect, the intermediate electroconductive layer is made of copper, aluminum, silver, gold, chromium, molybdenum, or an alloy of the above-mentioned metal materials.

The copper, aluminum, silver, gold, chromium, molybdenum or the alloy of the above-mentioned metal materials has the better electroconductive performance and the lower resistive property, and can satisfy the requirement of the display panel.

In this aspect, the first high attachment metal layer and the second high attachment metal layer are made of molybdenum or a molybdenum alloy.

The molybdenum or molybdenum alloy can achieve the better adhesion, can achieve the better sticky property with the metal material of the intermediate electroconductive layer, such as copper, aluminum, silver, gold, chromium, molybdenum or the like, on one side, and can achieve the better sticky property with other layers of the display panel, such as the substrate, resist layer, insulating layer and the like, on the other side. The materials can be easily selected, and the production technology is well developed. Additional raw materials are not needed, the raw material cost and the storage cost are decreased, no new material needs to be added to the bill of materials, it is convenient to the flow manage and purchase, no additional apparatus for disposing the second high attachment metal layer is needed, one set of equipment apparatus may be shared in forming the first high attachment metal layer, and no additional equipment and materials are required in the post etching.

In this aspect, the first layer of wires comprise a wire segment of a gate disposed on a thin film transistor; and the first layer of wires are disposed with a second high attachment metal layer only on the wire segment of the gate.

The wire segment of the gate of the thin film transistor adopts the first layer of wires with the three-layer structure, and other wires on the substrate are the wires adopting a two-layer mechanism, thereby decreasing the thickness of the display panel.

In this aspect, an insulating layer is disposed on a wire segment of a gate, a semiconductor layer corresponding to the wire segment of the gate is disposed on the insulating layer, a source and a drain of the thin film transistor separated from each other are disposed on two ends of the semiconductor layer, a trench is disposed between the source and the drain, and a bottom portion of the trench is the semiconductor layer.

The first layer of wires adopted in the thin film transistor comprises the second high attachment metal layer to enhance the sticky property between the wire segment of the gate and the insulating layer on the wire segment of the gate, and enhance the performance of the thin film transistor.

In this aspect, the first layer of wires are integrally covered with the first high attachment metal layer and the second high attachment metal layer, the insulating layer is disposed on the first layer of wires, the first layer of wires comprise the wire segment of the gate disposed on the thin film transistor, the semiconductor layer corresponding to the wire segment of the gate is disposed on the insulating layer, the source and the drain of the thin film transistor separated from each other are disposed on the two ends of the semiconductor layer, the trench is disposed between the source and the drain, and the bottom portion of the trench is the semiconductor layer.

The substrate is integrally covered with the first layer of wires. Either the wire segment of the gate of the thin film transistor, or the connection section between the column scan driver and the wire segment of the gate of the thin film transistor adopts the three-layer structure, so that the overall sticky property of the display panel is better, the quality of the first layer of wires is improved, the product yield is increased, and the manufacturing cost is decreased.

According to another aspect of this disclosure, this disclosure further discloses a method of manufacturing a display panel comprising steps of: disposing a first high attachment metal layer on a substrate; disposing an intermediate electroconductive layer on the first high attachment metal layer; disposing a second high attachment metal layer on the intermediate electroconductive layer; and etching the first high attachment metal layer, the intermediate electroconductive layer and the second high attachment metal layer to form a first layer of wires.

The first high attachment metal layer, the intermediate electroconductive layer and the second high attachment metal layer of the first layer of wires are disposed on the substrate in order, and then etched in the same process. The quality of the first layer of wires is improved, the product yield is increased, the manufacturing cost is decreased, the sticky properties between the first layer of wires and the substrate and other layers are enhanced, and the peeling of the first layer of wires and the peeling of other layers connected to the first layer of wires cannot be easily caused. The first high attachment metal layer and the second high attachment metal layer adopt the same material, additional raw materials are not needed, the raw material cost and the storage cost are decreased, no new material needs to be added to the bill of materials, it is convenient to the flow manage and purchase, no additional apparatus for disposing the second high attachment metal layer is needed, one set of equipment apparatus may be shared in forming the first high attachment metal layer, and no additional equipment and materials are required in the post etching.

In this aspect, the intermediate electroconductive layer is etched to have a top portion and a bottom portion wider than the top portion, the first high attachment metal layer is etched to have a width the same as a width of the bottom portion of the intermediate electroconductive layer, and the second high attachment metal layer is etched to have a width the same as a width of the top portion of the intermediate electroconductive layer.

Since the width of the bottom portion of the intermediate electroconductive layer is greater than the width of the top portion of the intermediate electroconductive layer, the operation is convenient, the formation is stable, the yield is high, the width of the first high attachment metal layer is the same as the width of the bottom portion of the intermediate electroconductive layer, the width of the second high attachment metal layer is the same as the width of the top portion of the intermediate electroconductive layer, it is convenient to the manufacturing, the contact surface areas between the intermediate electroconductive layer and the first high attachment metal layer and the second high attachment metal layer become the maximum, and the sticky effect becomes better, wherein the intermediate electroconductive layer is preferably a trapezoid, and more particularly an isosceles trapezoid.

The first layer of wires of the display panel connected to the column scan driver adopt the three-layer structure, which comprises, from bottom to top in order, the first high attachment metal layer connected to the substrate, the intermediate electroconductive layer and the second high attachment metal layer. The intermediate electroconductive layer may be made using a metal material having a lower resistance characteristic to effectively reduce the resistance and the parasitic capacitance of the first layer of wires of the display panel. The first high attachment metal layer and the second high attachment metal layer of the first layer of wires adopt a metal material having better adhesion performance, so that the intermediate electroconductive layer may be stuck and fixed to the first high attachment metal layer and the second high attachment metal layer very well, while the intermediate electroconductive layer may further be stuck and fixed to the upper and lower layers through the first high attachment metal layer and the second high attachment metal layer, the sticky property is better, and the peeling of the intermediate electroconductive layer and the upper and lower layers cannot be easily caused. The electrical performance of the first layer of wires of the display panel can be satisfied very well, and the first layer of wires further can be stuck and fixed to the upper and lower layers very well, so the product yield is increased, and the manufacturing cost is decreased.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

Specific structures and function details disclosed herein are only for the illustrative purpose for describing the exemplary embodiment of this disclosure. However, this disclosure can be specifically implemented through many replacements, and should not be explained as being restricted to only the embodiment disclosed herein.

In the description of this disclosure, it is to be understood that the terms "center", "transversal", "up," "down," "left," "right," "vertical", "horizontal", "top," "bottom," "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure. In addition, the terms "first," and "second" are used for the illustrative purpose only and cannot be understood as indicating or implying the relative importance or implicitly specifying the number of indicated technical features. Therefore, the features restricted by "first" and "second" may expressly or implicitly comprise one or multiple ones of the features. In the description of this disclosure, unless otherwise described, the meaning of "multiple" comprises two or more than two. In addition, the terms "comprises" and any modification thereof intend to cover the non-exclusive inclusions.

In the description of this disclosure, it needs to be described that, unless otherwise expressly stated and limited, the terms "mount," "link" and "connect" should be broadly understood. For example, they may be the fixed connection, may be the detachable connection or may be the integral connection; may be the mechanical connection or may also be the electrical connection; or may be the direct connection, may be the indirect connection through a middle medium or may be the inner communication between two elements. It will be apparent to those skilled in the art that the specific meanings of the above terms in this application may be understood according to the specific conditions.

The terms used herein are for the purpose of describing only specific embodiments and are not intended to limit the exemplary embodiments. Unless the contexts clearly indicate otherwise, the singular form "one," "a" and "an" used here further intend to include plural forms. It should also be understood that the terms "comprising" and/or "including" are used herein to describe the features to describe the presence of stated features, integers, steps, operations, units and/or elements without excluding the presence or addition of one or more other features, integers, steps, operations, units, elements, and/or combinations thereof.

This disclosure will be further described below with reference to the accompanying drawings and preferred embodiments.

The display panel and the method of manufacturing the same according to the embodiment of this disclosure will be described with reference to FIGS. 1 to 10.

Figure 1:
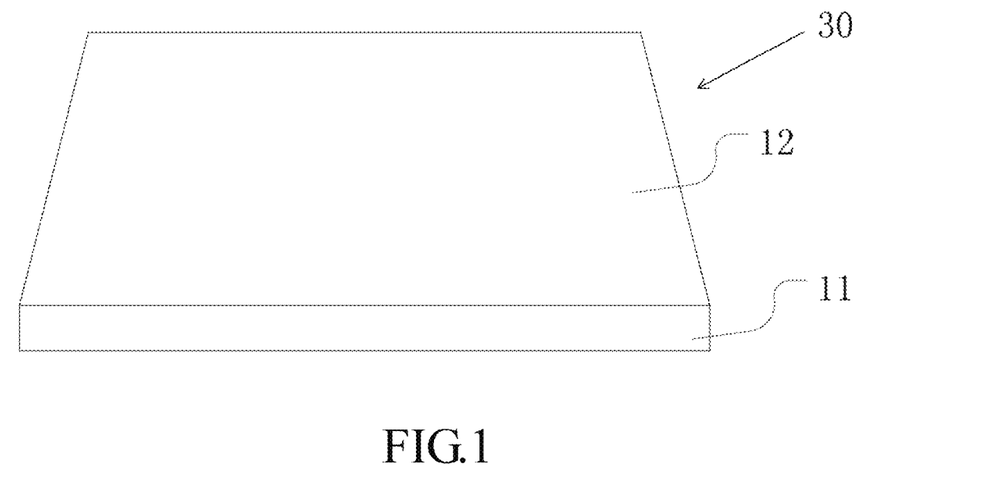
FIG. 1 is a schematically cross-sectional view showing a first layer of wires of a display panel according to the embodiment of this disclosure.
Figure 2:
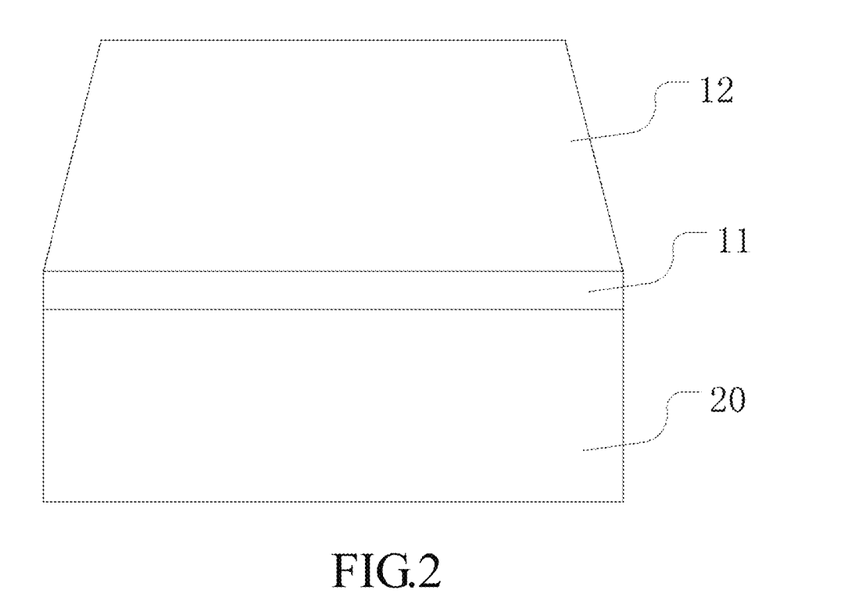
FIG. 2 is a schematic view showing a portion of a display panel according to the embodiment of this disclosure.

As shown in FIGS. 1 and 2, a display panel in an embodiment of FIGS. 1 and 2 comprises a substrate 20 and a first layer of wires 30. The first layer of wires 30 are disposed on the substrate 20, a lower portion of the first layer of wires 30 comprises an attachment metal layer 11, an upper portion of the first layer of wires 30 comprises an electroconductive layer 12, and the first layer of wires 30 is connected to a column scan driver of the display panel. The first layer of wires of the display panel connected to the column scan driver 30 adopt a two-layer structure, which comprises, from bottom to top in order, the attachment metal layer 11 connected to the substrate 20 and the electroconductive layer 12. The electroconductive layer 12 adopts a metal material having a lower resistance characteristic to effectively reduce the resistance and the parasitic capacitance of the first layer of wires 30 of the display panel, the attachment metal layer 11 of the first layer of wires 30 adopts a metal material having better adhesion performance, so that the electroconductive layer 12 may be stuck and fixed to the attachment metal layer 11 very well, while the electroconductive layer 12 can be stuck and fixed to the substrate 20 through the attachment metal layer 11, the sticky property is better, and the peeling of the electroconductive layer 12 and the substrate 20 cannot be easily caused. The electrical performance of the first layer of wires 30 of the display panel can be satisfied very well, and the first layer of wires further can be stuck and fixed to the substrate 20, so the product yield is increased, and the manufacturing cost is decreased.

Figure 3:
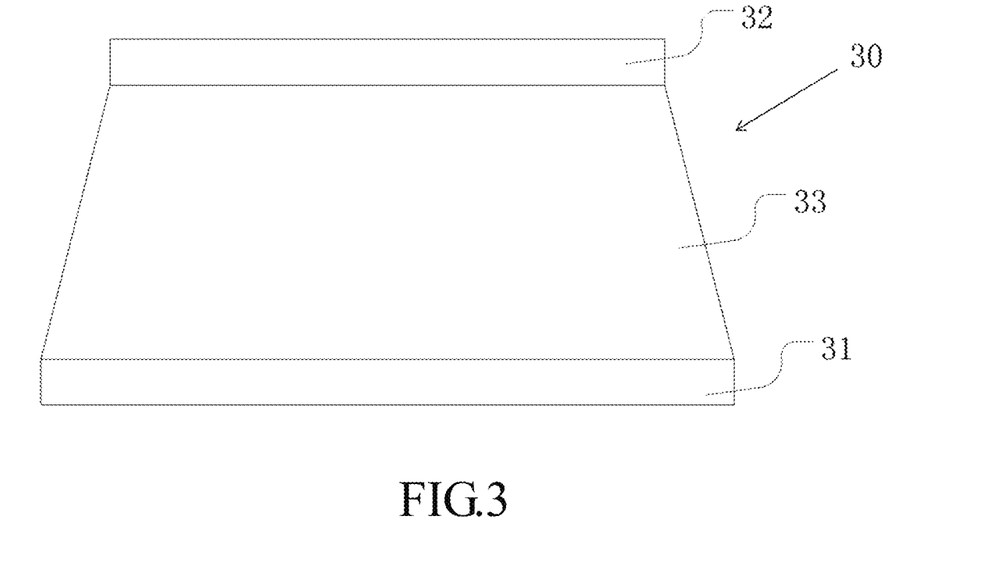
FIG. 3 another schematically cross-sectional view showing a first layer of wires of a display panel according to the embodiment of this disclosure.
Figure 4:
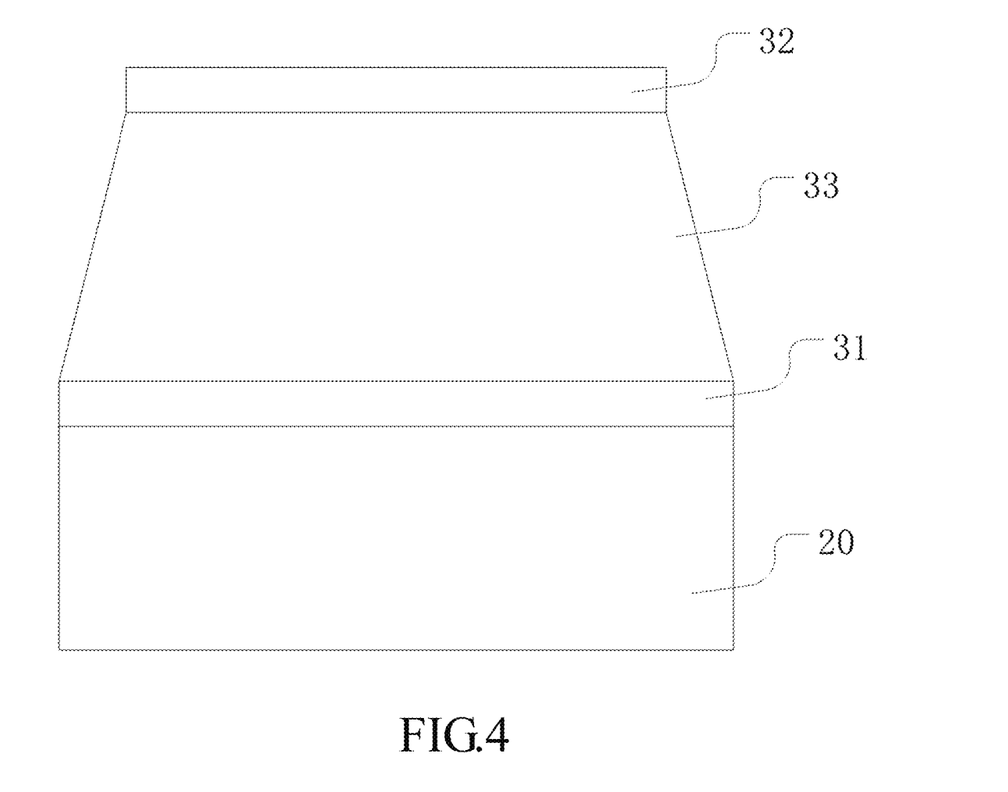
FIG. 4 is another schematic view showing a portion of a display panel according to the embodiment of this disclosure.

As shown in FIGS. 3 and 4, a display panel in an embodiment of FIGS. 3 and 4 comprises a substrate 20 and a first layer of wires 30. The first layer of wires 30 are disposed on the substrate 20, a lower portion of the first layer of wires 30 comprises a first high attachment metal layer 31, an upper portion of the first layer of wires 30 comprises a second high attachment metal layer 32, a middle of the first layer of wires 30 comprises an intermediate electroconductive layer 33, and the first layer of wires 30 is connected to a column scan driver of the display panel.

The first layer of wires of the display panel connected to the column scan driver 30 adopt a three-layer structure, which comprises, from bottom to top in order, the first high attachment metal layer 31 connected to the substrate 20, the intermediate electroconductive layer 33 and the second high attachment metal layer 32. The intermediate electroconductive layer 33 may be made using a metal material having a lower resistance characteristic to effectively reduce the resistance and the parasitic capacitance of the first layer of wires 30 of the display panel. The first high attachment metal layer 31 and the second high attachment metal layer 32 of the first layer of wires 30 adopt a metal material having better adhesion performance, so that the intermediate electroconductive layer 33 may be stuck and fixed to the first high attachment metal layer 31 and the second high attachment metal layer 32 very well, while the intermediate electroconductive layer 33 may further be stuck and fixed to the upper and lower layers through the first high attachment metal layer 31 and the second high attachment metal layer 32, the sticky property is better, and the peeling of the intermediate electroconductive layer 33 and the upper and lower layers cannot be easily caused. The electrical performance of the first layer of wires 30 of the display panel can be satisfied very well, and the first layer of wires further can be stuck and fixed to the upper and lower layers very well, so the product yield is increased, and the manufacturing cost is decreased.

As shown in FIG. 4, a display panel in an embodiment of FIG. 4 comprises a substrate 20 and a first layer of wires 30. The first layer of wires 30 are disposed on the substrate 20, a lower portion of the first layer of wires 30 comprises a first high attachment metal layer 31, an upper portion of the first layer of wires 30 comprises a second high attachment metal layer 32, a middle of the first layer of wires 30 comprises an intermediate electroconductive layer 33, and the first layer of wires 30 is connected to a column scan driver of the display panel.

The first layer of wires of the display panel connected to the column scan driver 30 adopt a three-layer structure, which comprises, from bottom to top in order, the first high attachment metal layer 31 connected to the substrate 20, the intermediate electroconductive layer 33 and the second high attachment metal layer 32. The intermediate electroconductive layer 33 may be made using a metal material having a lower resistance characteristic to effectively reduce the resistance and the parasitic capacitance of the first layer of wires 30 of the display panel. The first high attachment metal layer 31 and the second high attachment metal layer 32 of the first layer of wires 30 adopt a metal material having better adhesion performance, so that the intermediate electroconductive layer 33 may be stuck and fixed to the first high attachment metal layer 31 and the second high attachment metal layer 32 very well, while the intermediate electroconductive layer 33 may further be stuck and fixed to the upper and lower layers through the first high attachment metal layer 31 and the second high attachment metal layer 32, the sticky property is better, and the peeling of the intermediate electroconductive layer 33 and the upper and lower layers cannot be easily caused. The electrical performance of the first layer of wires 30 of the display panel can be satisfied very well, and the first layer of wires further can be stuck and fixed to the upper and lower layers very well, so the product yield is increased, and the manufacturing cost is decreased.

A thickness of the intermediate electroconductive layer 33 is greater than a thickness of the first high attachment metal layer 31 and a thickness of the second high attachment metal layer 32. The thickness of the intermediate electroconductive layer 33 is greater than the thickness of the first high attachment metal layer 31, and is also greater than the thickness of the second high attachment metal layer 32. The intermediate electroconductive layer 33 may be made using a metal material having a lower resistance characteristic, wherein the larger thickness can effectively reduce the resistance and the parasitic capacitance of the first layer of wires 30 of the panel. The first high attachment metal layer 31 and the second high attachment metal layer 32 adopt a metal material having better adhesion performance. The intermediate electroconductive layer 33 is connected to the upper and lower layers through the first high attachment metal layer 31 and the second high attachment metal layer 32, the sticky property is better, and the peeling of the intermediate electroconductive layer 33 and the upper and lower layers cannot be easily caused. The first high attachment metal layer 31 and the second high attachment metal layer 32 are mainly used to be stuck to the upper and lower layers with the small thickness to save the cost. Optionally, the thickness of the intermediate electroconductive layer 33 may be greater than the thickness of the first high attachment metal layer 31 plus the thickness of the second high attachment metal layer 32.

Optionally, a width of a bottom portion of the intermediate electroconductive layer 33 is greater than a width of a top portion of the intermediate electroconductive layer. The width of the first high attachment metal layer 31 is the same as the width of the bottom portion of the intermediate electroconductive layer 33, and the width of the second high attachment metal layer 32 is the same as the width of the intermediate electroconductive layer 33 top portion. Since the width of the bottom portion of the intermediate electroconductive layer 33 is greater than the width of the top portion of the intermediate electroconductive layer, it is convenient to the manufacturing, the formation is stable, and the yield is high. Since the width of the first high attachment metal layer 31 is the same as the width of the bottom portion of the electroconductive layer 33, and the width of the second high attachment metal layer 32 is the same as the width of the top portion of the intermediate electroconductive layer 33, it is convenient to the manufacturing, the contact surface areas between the intermediate electroconductive layer 33 and the first high attachment metal layer 31 and the second high attachment metal layer 32 become the maximum, and the sticky effect becomes better, wherein the intermediate electroconductive layer 33 is preferably a trapezoid, and more particularly an isosceles trapezoid.

The intermediate electroconductive layer 33 may be made of copper, aluminum, silver, gold, chromium, molybdenum or an alloy of the above-mentioned metal materials. The copper, aluminum, silver, gold, chromium, molybdenum or the alloy of the above-mentioned metal materials has the better electroconductive performance and the lower resistive property and can satisfy the requirement of the display panel. The intermediate electroconductive layer is preferably the copper or copper alloy, which is most cost-effective.

The first high attachment metal layer 31 and the second high attachment metal layer 32 are formed using molybdenum (Mo) or a molybdenum alloy. The molybdenum or molybdenum alloy can achieve the better adhesion, can achieve the better sticky property with the metal material of the intermediate electroconductive layer 33, such as copper, aluminum, silver, gold, chromium, molybdenum or the like, on one side, and can achieve the better sticky property with other layers of the display panel, such as the substrate, resist layer, insulating layer and the like, on the other side. The materials can be easily selected, and the production technology is well developed. Additional raw materials are not needed, the raw material cost and the storage cost are decreased, no new material needs to be added to the bill of materials, it is convenient to the flow manage and purchase, no additional apparatus for disposing the second high attachment metal layer 32 is needed, one set of equipment apparatus may be shared in forming the first high attachment metal layer 31, and no additional equipment and materials are required in the post etching.

As shown in FIGS. 5 to 8, a display panel in an embodiment of FIGS. 5 to 8 comprises a substrate and a first layer of wires 30. The first layer of wires 30 are disposed on the substrate, a lower portion of the first layer of wires 30 comprises a first high attachment metal layer 31, an upper portion of the first layer of wires 30 comprises a second high attachment metal layer 32, a middle of the first layer of wires 30 comprises an intermediate electroconductive layer 33, and the first layer of wires 30 is connected to a column scan driver of the display panel.

The first layer of wires of the display panel connected to the column scan driver 30 adopt a three-layer structure, which comprises, from bottom to top in order, the first high attachment metal layer 31 connected to the substrate, the intermediate electroconductive layer 33 and the second high attachment metal layer 32. The intermediate electroconductive layer 33 may be made using a metal material having a lower resistance characteristic to effectively reduce the resistance and the parasitic capacitance of the first layer of wires 30 of the display panel. The first high attachment metal layer 31 and the second high attachment metal layer 32 of the first layer of wires 30 adopt a metal material having better adhesion performance, so that the intermediate electroconductive layer 33 may be stuck and fixed to the first high attachment metal layer 31 and the second high attachment metal layer 32 very well, while the intermediate electroconductive layer 33 may further be stuck and fixed to the upper and lower layers through the first high attachment metal layer 31 and the second high attachment metal layer 32, the sticky property is better, and the peeling of the intermediate electroconductive layer 33 and the upper and lower layers cannot be easily caused. The electrical performance of the first layer of wires 30 of the display panel can be satisfied very well, and the first layer of wires further can be stuck and fixed to the upper and lower layers very well, so the product yield is increased, and the manufacturing cost is decreased.

The first layer of wires 30 comprise a wire segment of a gate and a gate wire disposed on a thin film transistor 40, wherein the gate wire is directly connected to the scan line drive; and the first layer of wires are disposed with a second high attachment metal layer only on the wire segment of the gate. The wire segment of the gate of the thin film transistor 40 adopts the first layer of wires 30 with the three-layer structure, and other wires on the substrate are the wires adopting a two-layer mechanism, thereby decreasing the thickness of the display panel.

An insulating layer 42 is disposed on the wire segment of the gate, a semiconductor layer 43 corresponding to the wire segment 41 of the gate is disposed on the insulating layer 42, a source 44 and a drain 45 of the thin film transistor 40 separated from each other are disposed on two ends of the semiconductor layer 43, a trench 46 is disposed between the source 44 and the drain 45, and a bottom portion of the trench 46 is the semiconductor layer 43. The first layer of wires adopted in the thin film transistor 40 comprises a second high attachment metal layer to enhance the sticky property between the wire segment 41 of the gate and the insulating layer 42 on the wire segment 41 of the gate, and enhance the performance of the thin film transistor 40.

The thickness of the intermediate electroconductive layer 33 is greater than the thickness of the first high attachment metal layer 31 and the thickness of the second high attachment metal layer 32. The thickness of the intermediate electroconductive layer 33 is greater than the thickness of the first high attachment metal layer 31 and is also greater than the thickness of the second high attachment metal layer 32. The intermediate electroconductive layer 33 may be made using a metal material having a lower resistance characteristic, wherein the larger thickness can effectively reduce the resistance and the parasitic capacitance of the first layer of wires 30 of the panel. The first high attachment metal layer 31 and the second high attachment metal layer 32 are formed using a metal material having better adhesion performance. The intermediate electroconductive layer 33 is connected to the upper and lower layers through the first high attachment metal layer 31 and the second high attachment metal layer 32, the sticky property is better, and the peeling of the intermediate electroconductive layer 33 and the upper and lower layers cannot be easily caused, The first high attachment metal layer 31 and the second high attachment metal layer 32 are mainly used to be stuck to the upper and lower layers with the small thickness to save the cost, Optionally, the thickness of the intermediate electroconductive layer 33 may be greater than the thickness of the first high attachment metal layer 31 plus the thickness of the second high attachment metal layer 32.

Optionally, a width of a bottom portion of the intermediate electroconductive layer 33 is greater than a width of a top portion of the intermediate electroconductive layer. The width of the first high attachment metal layer 31 is the same as the width of the bottom portion of the intermediate electroconductive layer 33, and the width of the second high attachment metal layer 32 is the same as the width of the intermediate electroconductive layer 33 top portion. Since the width of the bottom portion of the intermediate electroconductive layer 33 is greater than the width of the top portion of the intermediate electroconductive layer, it is convenient to the manufacturing, the formation is stable, and the yield is high. Since the width of the first high attachment metal layer 31 is the same as the width of the bottom portion of the electroconductive layer 33, and the width of the second high attachment metal layer 32 is the same as the width of the top portion of the intermediate electroconductive layer 33, it is convenient to the manufacturing, the contact surface areas between the intermediate electroconductive layer 33 and the first high attachment metal layer 31 and the second high attachment metal layer 32 become the maximum, and the sticky effect becomes better, wherein the intermediate electroconductive layer 33 is preferably a trapezoid, and more particularly an isosceles trapezoid.

The intermediate electroconductive layer 33 may be made of copper, aluminum, silver, gold, chromium, molybdenum or an alloy of the above-mentioned metal materials. The copper, aluminum, silver, gold, chromium, molybdenum or the alloy of the above-mentioned metal materials has the better electroconductive performance and the lower resistive property and can satisfy the requirement of the display panel. The intermediate electroconductive layer is preferably the copper or copper alloy, which is most cost-effective.

The first high attachment metal layer 31 and the second high attachment metal layer 32 are formed using molybdenum (Mo) or a molybdenum alloy. The molybdenum or molybdenum alloy can achieve the better adhesion, can achieve the better sticky property with the metal material of the intermediate electroconductive layer 33, such as copper, aluminum, silver, gold, chromium, molybdenum or the like, on one side, and can achieve the better sticky property with other layers of the display panel, such as the substrate, resist layer, insulating layer and the like, on the other side. The materials can be easily selected, and the production technology is well developed. Additional raw materials are not needed, the raw material cost and the storage cost are decreased, no new material needs to be added to the bill of materials, it is convenient to the flow manage and purchase, no additional apparatus for disposing the second high attachment metal layer 32 is needed, one set of equipment apparatus may be shared in forming the first high attachment metal layer 31, and no additional equipment and materials are required in the post etching.

Figure 5:
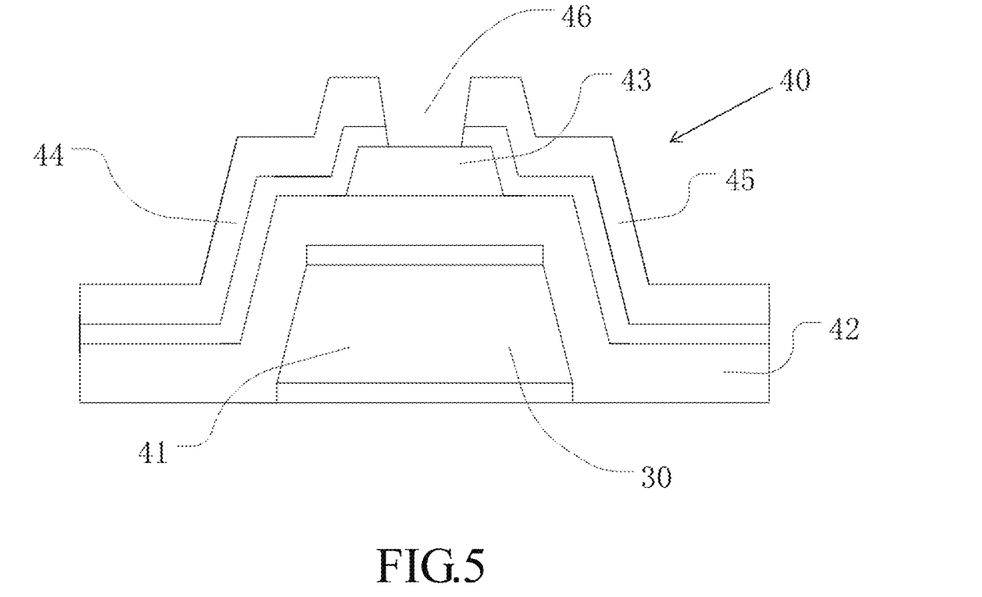
FIG. 5 is a schematic view showing a thin film transistor of a display panel according to the embodiment of this disclosure.
Figure 6:
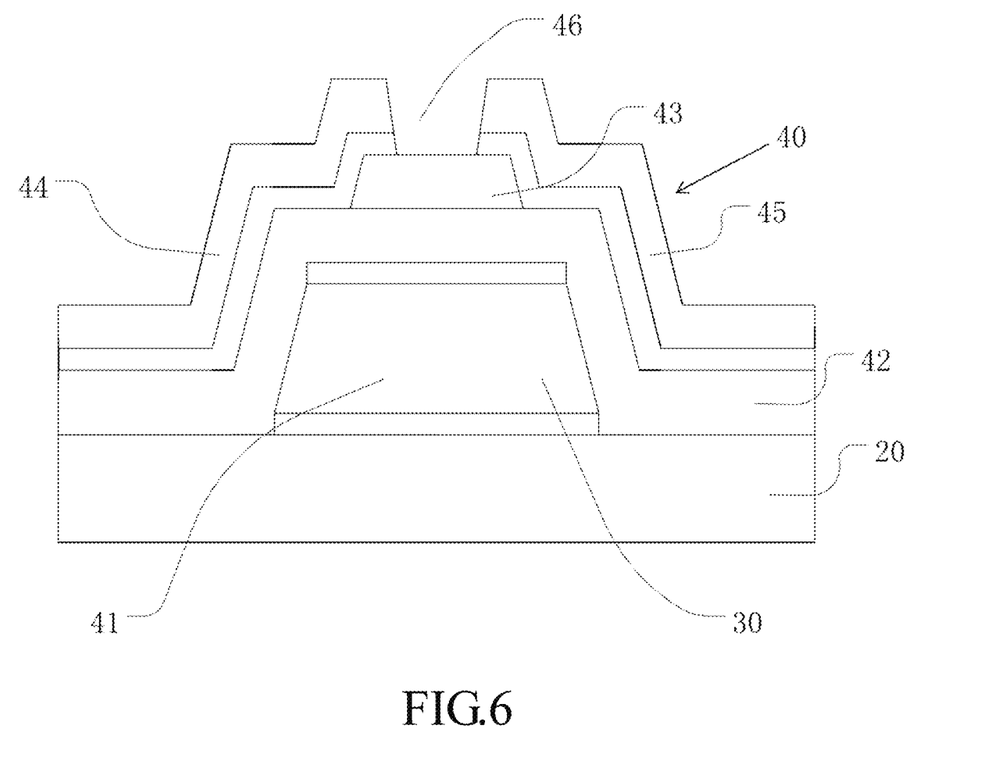
FIG. 6 is another schematic view showing a thin film transistor of a display panel according to the embodiment of this disclosure.
Figure 9:
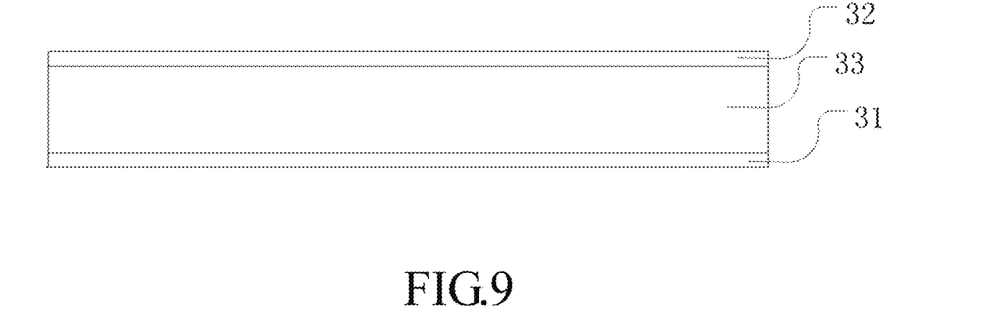
FIG. 9 is another schematic view showing a first layer of wires of a display panel according to the embodiment of this disclosure.

As shown in FIGS. 5, 6 and 9, a display panel in an embodiment of FIGS. 5, 6 and 9 comprises a substrate and a first layer of wires 30. The first layer of wires 30 are disposed on the substrate, a lower portion of the first layer of wires 30 comprises a first high attachment metal layer 31, an upper portion of the first layer of wires 30 comprises a second high attachment metal layer 32, a middle of the first layer of wires 30 comprises an intermediate electroconductive layer 33, and the first layer of wires 30 is connected to a column scan driver of the display panel.

The first layer of wires of the display panel connected to the column scan driver 30 adopt a three-layer structure, which comprises, from bottom to top in order, the first high attachment metal layer 31 connected to the substrate, the intermediate electroconductive layer 33 and the second high attachment metal layer. The intermediate electroconductive layer 33 may be made using a metal material having a lower resistance characteristic to effectively reduce the resistance and the parasitic capacitance of the first layer of wires 30 of the display panel. The first high attachment metal layer 31 and the second high attachment metal layer of the first layer of wires 30 adopt a metal material having better adhesion performance, so that the intermediate electroconductive layer 33 may be stuck and fixed to the first high attachment metal layer 31 and the second high attachment metal layer very well, while the intermediate electroconductive layer 33 may further be stuck and fixed to the upper and lower layers through the first high attachment metal layer 31 and the second high attachment metal layer, the sticky property is better, and the peeling of the intermediate electroconductive layer 33 and the upper and lower layers cannot be easily caused. The electrical performance of the first layer of wires 30 of the display panel can be satisfied very well, and the first layer of wires further can be stuck and fixed to the upper and lower layers very well, so the product yield is increased, and the manufacturing cost is decreased.

The first layer of wires 30 are integrally covered with the first high attachment metal layer and the second high attachment metal layer, the insulating layer 42 is disposed on the first layer of wires 30, the first layer of wires 30 comprise the wire segment of the gate disposed on the thin film transistor 40, the semiconductor layer 43 corresponding to the wire segment 41 of the gate is disposed on the insulating layer 42, the source 44 and the drain 45 of the thin film transistor 40, which are separated from each other, are disposed on the two ends of the semiconductor layer 43, the trench 46 is disposed between the source 44 and the drain 45, and the bottom portion of the trench 46 is the semiconductor layer 43. The substrate is integrally covered with the first layer of wires 30, the three-layer structure is adopted in either the wire segment of the gate of the thin film transistor 40 or the connection section between the column scan driver and the wire segment 41 of the gate of the thin film transistor 40, the overall sticky property of the display panel is better, the quality of the first layer of wires 30 is improved, the product yield is increased, and the manufacturing cost is decreased.

The thickness of the intermediate electroconductive layer 33 is greater than the thickness of the first high attachment metal layer 31 and the thickness of the second high attachment metal layer 32. The thickness of the intermediate electroconductive layer 33 is greater than the thickness of the first high attachment metal layer 31 and is also greater than the thickness of the second high attachment metal layer 32. The intermediate electroconductive layer 33 may be made using a metal material having a lower resistance characteristic, wherein the larger thickness can effectively reduce the resistance and the parasitic capacitance of the first layer of wires 30 of the panel. The first high attachment metal layer 31 and the second high attachment metal layer 32 are formed using a metal material having better adhesion performance. The intermediate electroconductive layer 33 is connected to the upper and lower layers through the first high attachment metal layer 31 and the second high attachment metal layer 32, the sticky property is better, and the peeling of the intermediate electroconductive layer 33 and the upper and lower layers cannot be easily caused, The first high attachment metal layer 31 and the second high attachment metal layer 32 are mainly used to be stuck to the upper and lower layers with the small thickness to save the cost, Optionally, the thickness of the intermediate electroconductive layer 33 may be greater than the thickness of the first high attachment metal layer 31 plus the thickness of the second high attachment metal layer 32.

Optionally, a width of a bottom portion of the intermediate electroconductive layer 33 is greater than a width of a top portion of the intermediate electroconductive layer. The width of the first high attachment metal layer 31 is the same as the width of the bottom portion of the intermediate electroconductive layer 33, and the width of the second high attachment metal layer 32 is the same as the width of the intermediate electroconductive layer 33 top portion. Since the width of the bottom portion of the intermediate electroconductive layer 33 is greater than the width of the top portion of the intermediate electroconductive layer, it is convenient to the manufacturing, the formation is stable, and the yield is high. Since the width of the first high attachment metal layer 31 is the same as the width of the bottom portion of the electroconductive layer 33, and the width of the second high attachment metal layer 32 is the same as the width of the top portion of the intermediate electroconductive layer 33, it is convenient to the manufacturing, the contact surface areas between the intermediate electroconductive layer 33 and the first high attachment metal layer 31 and the second high attachment metal layer 32 become the maximum, and the sticky effect becomes better, wherein the intermediate electroconductive layer 33 is preferably a trapezoid, and more particularly an isosceles trapezoid.

The intermediate electroconductive layer 33 may be made of copper, aluminum, silver, gold, chromium, molybdenum or an alloy of the above-mentioned metal materials. The copper, aluminum, silver, gold, chromium, molybdenum or the alloy of the above-mentioned metal materials has the better electroconductive performance and the lower resistive property and can satisfy the requirement of the display panel. The intermediate electroconductive layer is preferably the copper or copper alloy, which is most cost-effective.

The first high attachment metal layer 31 and the second high attachment metal layer 32 are formed using molybdenum (Mo) or a molybdenum alloy. The molybdenum or molybdenum alloy can achieve the better adhesion, can achieve the better sticky property with the metal material of the intermediate electroconductive layer 33, such as copper, aluminum, silver, gold, chromium, molybdenum or the like, on one side, and can achieve the better sticky property with other layers of the display panel, such as the substrate, resist layer, insulating layer and the like, on the other side. The materials can be easily selected, and the production technology is well developed. Additional raw materials are not needed, the raw material cost and the storage cost are decreased, no new material needs to be added to the bill of materials, it is convenient to the flow manage and purchase, no additional apparatus for disposing the second high attachment metal layer 32 is needed, one set of equipment apparatus may be shared in forming the first high attachment metal layer 31, and no additional equipment and materials are required in the post etching.

Figure 7:
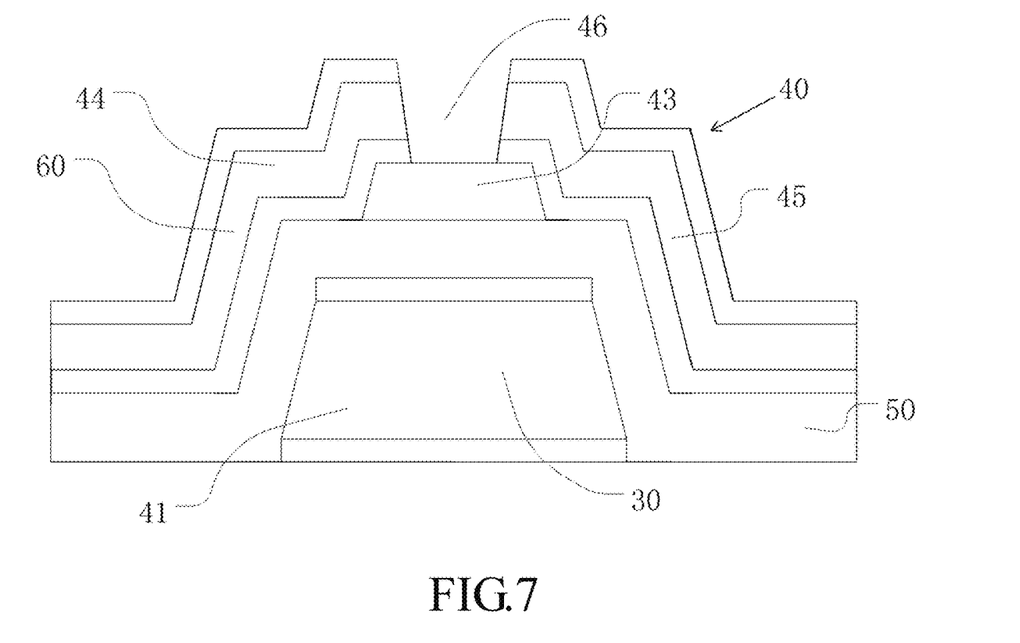
FIG. 7 is still another schematic view showing a thin film transistor of a display panel according to the embodiment of this disclosure.
Figure 8:
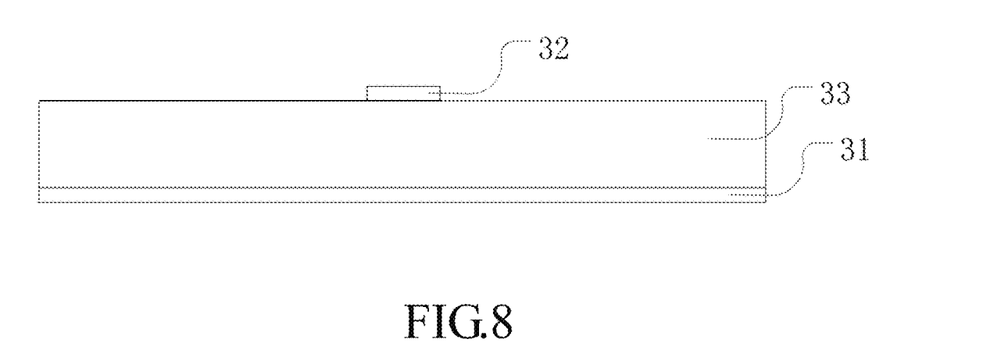
FIG. 8 is a schematic view showing a first layer of wires of a display panel according to the embodiment of this disclosure.

As shown in FIGS. 3 and 7, a display panel in an embodiment of FIGS. 3 and 7 comprises a substrate and a first layer of wires 30. The first layer of wires 30 are disposed on the substrate, a lower portion of the first layer of wires 30 comprises a first high attachment metal layer 31, an upper portion of the first layer of wires 30 comprises a second high attachment metal layer 32, a middle of the first layer of wires 30 comprises an intermediate electroconductive layer 33, and the first layer of wires 30 is connected to a column scan driver of the display panel.

The insulating layer 42 is disposed on the first layer of wires 30, the first layer of wires 30 comprise the wire segment of the gate disposed on the thin film transistor 40, the semiconductor layer 43 corresponding to the wire segment 41 of the gate is disposed on the insulating layer 42, the source 44 and the drain 45 of the thin film transistor 40, which are separated from each other, are disposed on the two ends of the semiconductor layer 43, the trench 46 is disposed between the source 44 and the drain 45, and the bottom portion of the trench 46 is the semiconductor layer 43.

A second layer of wires are disposed on the insulating layer 42. The second layer of wires comprise the source 44 and the drain 45. The lower portion of the second layer of wires comprises a third high attachment metal layer, an upper portion of the second layer of wires comprises a fourth high attachment metal layer, a middle of the second layer of wires comprises a second intermediate electroconductive layer, and the second layer of wires is coupled to the source driver of the display panel. The three-layer structure similar to that of the first layer of wires is adopted in the second layer of wires to enhance the performance of the thin film transistor, wherein the overall sticky property of the display panel is better, the quality of the second layer of wires is improved, the product yield is increased, and the manufacturing cost is decreased.

The intermediate electroconductive layer 33 and the second intermediate electroconductive layer may be made of copper, aluminum, silver, gold, chromium, molybdenum or an alloy of the above-mentioned metal materials. The copper, aluminum, silver, gold, chromium, molybdenum or the alloy of the above-mentioned metal materials has the better electroconductive performance and the lower resistive property and can satisfy the requirement of the display panel. The intermediate electroconductive layer is preferably the copper or copper alloy, which is most cost-effective.

The first high attachment metal layer 31 and the second high attachment metal layer 32 are formed using molybdenum (Mo) or a molybdenum alloy. The third high attachment metal layer and the fourth high attachment metal layer are formed using molybdenum (Mo) or a molybdenum alloy. The molybdenum or molybdenum alloy can achieve the better adhesion, can achieve the better sticky property with the metal material of the intermediate electroconductive layer 33, such as copper, aluminum, silver, gold, chromium, molybdenum or the like, on one side, and can achieve the better sticky property with other layers of the display panel, such as the substrate, resist layer, insulating layer and the like, on the other side. The materials can be easily selected, and the production technology is well developed. Additional raw materials are not needed, the raw material cost and the storage cost are decreased, no new material needs to be added to the bill of materials, it is convenient to the flow manage and purchase, no additional apparatus for disposing the second high attachment metal layer 32 is needed, one set of equipment apparatus may be shared in forming the first high attachment metal layer 31, and no additional equipment and materials are required in the post etching.

Figure 10:
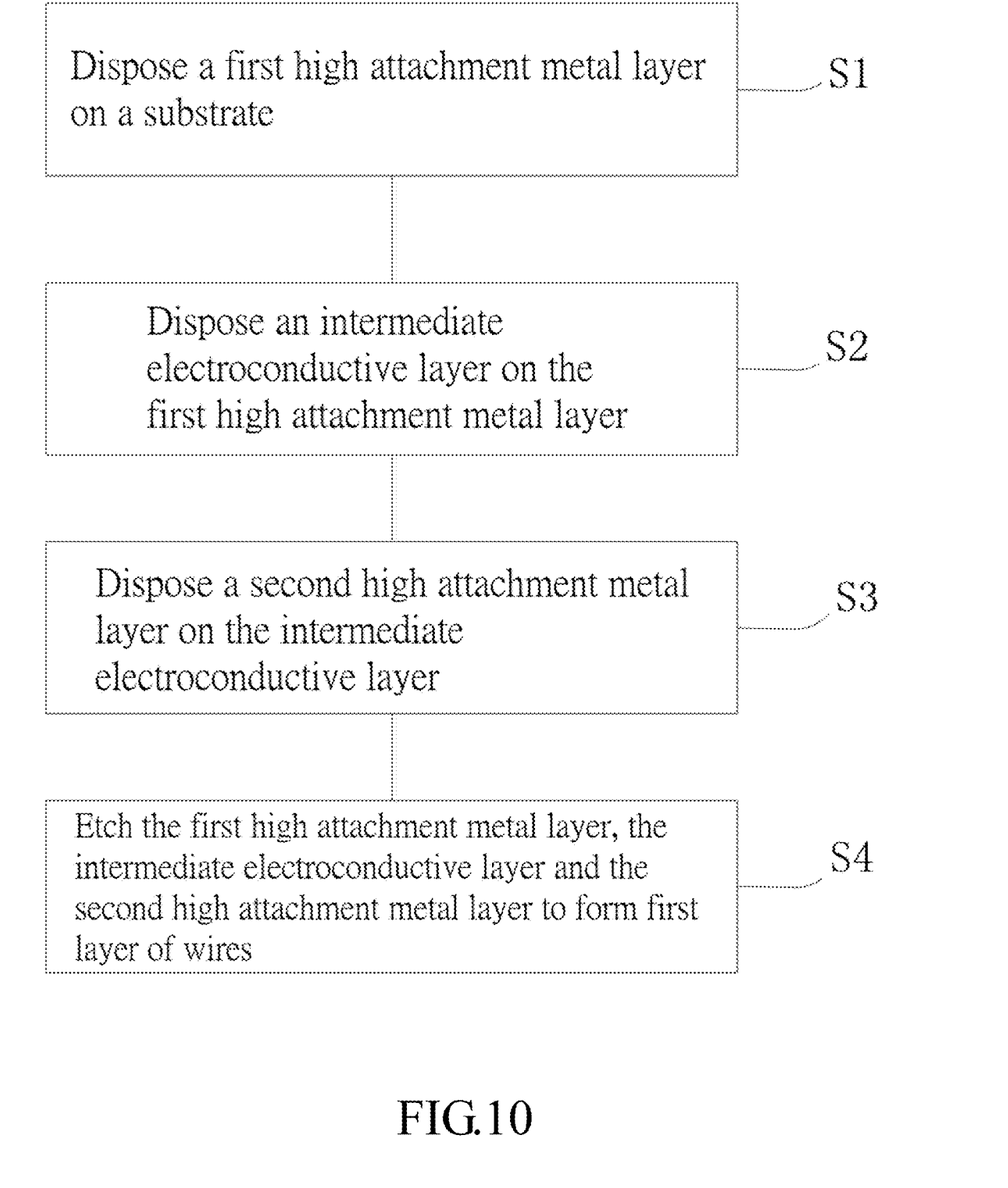
FIG. 10 is a schematic view showing a process of a display panel according to the embodiment of this disclosure.

According to another aspect of this disclosure, as shown in FIG. 10, this disclosure further discloses a method of manufacturing a display panel. The method comprises the following steps.

In step S1, a first high attachment metal layer is disposed on a substrate.

In step S2, an intermediate electroconductive layer is disposed on the first high attachment metal layer.

In step S3, a second high attachment metal layer is disposed on the intermediate electroconductive layer.

In step S4, the first high attachment metal layer, the intermediate electroconductive layer and the second high attachment metal layer are etched to form a first layer of wires.

The first high attachment metal layer, the intermediate electroconductive layer and the second high attachment metal layer of the first layer of wires are disposed on the substrate in order, and then etched in the same process. The quality of the first layer of wires is improved, the product yield is increased, the manufacturing cost is decreased, the sticky properties between the first layer of wires and the substrate and other layers are enhanced, and the peeling of the first layer of wires and the peeling of other layers connected to the first layer of wires cannot be easily caused. The first high attachment metal layer and the second high attachment metal layer adopt the same material, additional raw materials are not needed, the raw material cost and the storage cost are decreased, no new material needs to be added to the bill of materials, it is convenient to the flow manage and purchase, no additional apparatus for disposing the second high attachment metal layer is needed, one set of equipment apparatus may be shared in forming the first high attachment metal layer, and no additional equipment and materials are required in the post etching.

In this aspect, the intermediate electroconductive layer is etched to have a top portion and a bottom portion wider than the top portion, the first high attachment metal layer is etched to have a width the same as a width of the bottom portion of the intermediate electroconductive layer, and the second high attachment metal layer is etched to have a width the same as a width of the top portion of the intermediate electroconductive layer. Since the width of the bottom portion of the intermediate electroconductive layer is greater than the width of the top portion of the intermediate electroconductive layer, the operation is convenient, the formation is stable, the yield is high, the width of the first high attachment metal layer is the same as the width of the bottom portion of the intermediate electroconductive layer, the width of the second high attachment metal layer is the same as the width of the top portion of the intermediate electroconductive layer, it is convenient to the manufacturing, the contact surface areas between the intermediate electroconductive layer and the first high attachment metal layer and the second high attachment metal layer become the maximum, and the sticky effect becomes better, wherein the intermediate electroconductive layer is preferably a trapezoid, and more particularly an isosceles trapezoid.

A method of manufacturing a display panel comprises the following steps.

In step S1, a first high attachment metal layer is disposed on a substrate.

In step S2, an intermediate electroconductive layer is disposed on the first high attachment metal layer.

In step S3, a second high attachment metal layer is disposed on the intermediate electroconductive layer.

In step S4, the first high attachment metal layer, the intermediate electroconductive layer and the second high attachment metal layer are etched to form a first layer of wires.

In step S5, an insulating layer is disposed on the first layer of wires.

In step S6, a third high attachment metal layer is disposed on the insulating layer.

In step S7, a second intermediate electroconductive layer is disposed on the third high attachment metal layer.

In step S8, a fourth high attachment metal layer is disposed on the second intermediate electroconductive layer.

In step S9, the third high attachment metal layer, the second intermediate electroconductive layer and the fourth high attachment metal layer are etched to form a second layer of wires.

Optionally, the first layer of wires are the scan lines of the display panel, and the second layer of wires are the data lines of the display panel.

In the above-mentioned embodiment, the material of the substrate may be selected from a glass material, a plastic material and the like.

In the above-mentioned embodiment, the display panel comprises a liquid crystal panel, a plasma panel or the like. Taking the liquid crystal panel as an example, the liquid crystal panel comprises an array substrate and a color filter (CF) substrate disposed opposite to each other. A liquid crystal and a photo spacer (PS) are disposed between the array substrate and the color filter substrate. A thin film transistor (TFT) is disposed on the array substrate, and a color filter layer is disposed on the color filter substrate.

In the above-mentioned embodiment, the color filter substrate may comprise a TFT array, wherein the color filter and the TFT array may be formed on the same substrate, and the array substrate may comprise a color filter layer.

In the above-mentioned embodiment, the display panel of this disclosure may be a curved panel.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A display panel, comprising:
a substrate; and
a first layer of wires disposed on the substrate, wherein a lower portion of the first layer of wires comprises a first high attachment metal layer, an upper portion of the first layer of wires comprises a second high attachment metal layer, a middle of the first layer of wires comprises an intermediate electroconductive layer, and the first layer of wires are connected to a column scan driver of the display panel,
wherein the first layer of wires comprise a wire segment of a gate disposed on a thin film transistor; and the first layer of wires are disposed with the second high attachment metal layer only on the wire segment of the gate.

2. The display panel according to claim 1, wherein a thickness of the intermediate electroconductive layer is greater than a thickness of the first high attachment metal layer and a thickness of the second high attachment metal layer.

3. The display panel according to claim 1, wherein a width of a bottom portion of the intermediate electroconductive layer is greater than a width of a top portion of the intermediate electroconductive layer, a width of the first high attachment metal layer is the same as the width of the bottom portion of the intermediate electroconductive layer, and a width of the second high attachment metal layer is the same as the width of the top portion of the intermediate electroconductive layer.

4. The display panel according to claim 1, wherein the intermediate electroconductive layer is made of copper, aluminum, silver, gold, chromium, molybdenum, or any of their alloys.

5. The display panel according to claim 1, wherein the first high attachment metal layer and the second high attachment metal layer are made of molybdenum or a molybdenum alloy.

6. The display panel according to claim 1, wherein an insulating layer is disposed on the wire segment of the gate, a semiconductor layer corresponding to the wire segment of the gate is disposed on the insulating layer, a source and a drain of a thin film transistor separated from each other are disposed on two ends of the semiconductor layer, a trench is disposed between the source and the drain, and a bottom portion of the trench is the semiconductor layer.

7. The display panel according to claim 1, wherein the first layer of wires are integrally covered with the first high attachment metal layer and the second high attachment metal layer, an insulating layer is disposed on the first layer of wires, the first layer of wires comprise a wire segment of a gate disposed on a thin film transistor, a semiconductor layer corresponding to the wire segment of the gate is disposed on the insulating layer, a source and a drain of the thin film transistor separated from each other are disposed on two ends of the semiconductor layer, a trench is disposed between the source and the drain, and a bottom portion of the trench is the semiconductor layer.

8. A method of manufacturing a display panel, comprising steps of:
disposing a first high attachment metal layer on a substrate;
disposing an intermediate electroconductive layer on the first high attachment metal layer;
disposing a second high attachment metal layer on the intermediate electroconductive layer; and
etching the first high attachment metal layer, the intermediate electroconductive layer and the second high attachment metal layer to form a first layer of wires,
wherein the intermediate electroconductive layer is etched to have a top portion and a bottom portion wider than the top portion, the first high attachment metal layer is etched to have a width the same as a width of the bottom portion of the intermediate electroconductive layer, and the second high attachment metal layer is etched to have a width the same as a width of the top portion of the intermediate electroconductive layer, wherein the first layer of wires comprise a wire segment of a gate disposed on a thin film transistor, and the first layer of wires are disposed with the second attachment metal layer only on the wire segment of the gate.

9. The method according to claim 8, wherein the intermediate electroconductive layer is made of copper, aluminum, silver, gold, chromium, molybdenum, or any of their alloys.

10. The method according to claim 8, wherein the first high attachment metal layer and the second high attachment metal layer are made of molybdenum or a molybdenum alloy.

11. The method according to claim 8, wherein an insulating layer is disposed on the wire segment of the gate, a semiconductor layer corresponding to the wire segment of the gate is disposed on the insulating layer, a source and a drain of the thin film transistor separated from each other are disposed on two ends of the semiconductor layer, a trench is disposed between the source and the drain, and a bottom portion of the trench is the semiconductor layer.

12. The method according to claim 8, wherein the first layer of wires are integrally covered with the first high attachment metal layer and the second high attachment metal layer, an insulating layer is disposed on the first layer of wires, the first layer of wires comprise a wire segment of a gate disposed on a thin film transistor, a semiconductor layer corresponding to the wire segment of the gate is disposed on the insulating layer, a source and a drain of the thin film transistor separated from each other are disposed on two ends of the semiconductor layer, a trench is disposed between the source and the drain, and a bottom portion of the trench is the semiconductor layer.

* * * * *